(12) United States Patent
Yu

(10) Patent No.: US 7,318,660 B2
(45) Date of Patent: Jan. 15, 2008

(54) LIGHT EMITTING MODULE AND RELATED LIGHT SOURCE DEVICE

(75) Inventor: Tai-Cherng Yu, Guangdong (CN)

(73) Assignee: Hon Hai Precision Industry Co., Ltd., Taipei Hsien (TW)

( * ) Notice: Subject to any disclaimer, the term of this patent is extended or adjusted under 35 U.S.C. 154(b) by 157 days.

(21) Appl. No.: 11/306,591

(22) Filed: Jan. 4, 2006

(65) Prior Publication Data

US 2006/0209545 A1    Sep. 21, 2006

(30) Foreign Application Priority Data

Mar. 18, 2005  (CN) .................. 2005 1 0033735

(51) Int. Cl.
*F21V 29/00*    (2006.01)
(52) U.S. Cl. ...................... 362/294; 362/545
(58) Field of Classification Search ............. 362/545, 362/294, 373
See application file for complete search history.

(56) References Cited

U.S. PATENT DOCUMENTS

| | | | |
|---|---|---|---|
| 5,528,474 A * | 6/1996 | Roney et al. ............. 362/545 |
| 6,636,003 B2 | 10/2003 | Rahm et al. |
| 6,678,171 B1 * | 1/2004 | Drews et al. .............. 361/825 |
| 6,786,625 B2 * | 9/2004 | Wesson .................... 362/545 |
| 7,070,281 B2 * | 7/2006 | Kato ......................... 353/20 |
| 7,241,030 B2 * | 7/2007 | Mok et al. ................ 362/294 |
| 2006/0187660 A1 * | 8/2006 | Liu ........................... 362/294 |

* cited by examiner

*Primary Examiner*—Sandra O'Shea
*Assistant Examiner*—James W Cranson
(74) *Attorney, Agent, or Firm*—Winston Hsu

(57) ABSTRACT

A light emitting module (10) includes a metal circuit board (11), a number of light emitting units (12) arranged on a first surface of the metal circuit board, and a cooling system (13) mounted on an opposite second surface of the metal circuit board. A light source device (1) using the light emitting module further includes a housing (30) and a transparent light cover (20). The housing has a base with the light emitting module being mounted thereon. The transparent light cover covers the housing. The present light emitting module and light source device can improve the brightness of the light, and increase the utilization efficiency of light.

20 Claims, 5 Drawing Sheets

LIGHT EMITTING MODULE AND RELATED LIGHT SOURCE DEVICE

FIELD OF THE INVENTION

The present invention relates to light emitting modules, and more particularly, to a white light emitting module and a light source device using the same.

DESCRIPTION OF RELATED ART

In order to provide a proper contrast for items in an individual's viewing environment, it is desirable to have a white light output from a light source device. Incandescent bulbs and fluorescent lamps are capable of effectively providing such a white light or near white light output. However, there are significant drawbacks for the use of these types of light source devices for illumination, such as fragility of the lights themselves and their relatively short lifespan.

Because of the drawbacks in the use of incandescent bulbs and fluorescent lamps, the use of light emitting diodes (LEDs) for illumination has become increasingly popular. LEDs are diodes that have the "side effect" of producing light while electric current is flowing through them. In the simplest terms, an LED is made with two different kinds of semiconductor material: one type that has an excess of free electrons roaming around inside the material, and another that has a net positive charge and lacks electrons. When an electron from the first material, the donor, flows as a current across a thin barrier and into the second material, a photon or particle of light is produced.

Because LEDs produce light based on semiconductor principles of operation, the light output thereof is typically along a narrow wavelength band, i.e., a single color output. Recent advances, however, have resulted in LEDs that produce a near white light output. A known method being utilized to produce white light from LEDs employs a light emitting module that includes a plurality of regularly arranged red, green, and blue LEDs.

The light emitting module composed of LEDs typically lasts for 100,000 hours or more before the LEDs need to be replaced. The LEDs generate very little heat and require relatively little power. Therefore, LEDs are well suited for a wide variety of applications. The unique features of LEDs make them very attractive to many industries. However, one of the drawbacks of LED technology is that the brightness of an LED that is operated with a certain current is greatly affected by the ambient and its own temperature. For a circuit with a certain current, a typical LED will shine brighter in colder temperatures and more dimly in hotter temperatures. Further, the temperature of the light emitting module composed of LEDs will inevitably increase after an operation for a period of time, so its brightness will decrease. Thus, the brightness of the light emitting module is unstable during its use, and a utilization efficiency of light of the light emitting module is lowered after a long time of usage.

What are needed, therefore, are a light emitting module with high utilization efficiency of light, and a light source device using the light emitting module.

SUMMARY OF INVENTION

A light emitting module according to one preferred embodiment includes a metal circuit board, a number of light emitting units arranged on a first surface of the metal circuit board, and a cooling system mounted on an opposite second surface of the metal circuit board.

A light source device according to one preferred embodiment includes a light emitting module, a housing and a transparent light cover. The light emitting module includes a metal circuit board, a number of light emitting units arranged on a first surface of the metal circuit board, and a cooling system mounted on an opposite second surface of the metal circuit board. The housing has a base with the light emitting module being mounted thereon. The transparent light cover covers the housing.

Compared with conventional light emitting module, the present light emitting module has following advantages. Because the cooling system is used, with the circulation of the cooling liquid in the cooling passage, the heat generated by the light emitting units can be effectively dissipated. The temperature of the LEDs is lowered, and maintained in a safety range. Thus, the light emitting capability of the LEDs can be fully exploited. The brightness of the light emitting module is improved, and the utilization efficiency of light thereof is also increased, accordingly.

Other advantages and novel features will become more apparent from the following detailed description of present light emitting module, when taken in conjunction with the accompanying drawings.

BRIEF DESCRIPTION OF DRAWINGS

Many aspects of the present light emitting module and light source device can be better understood with reference to the following drawings. The components in the drawings are not necessarily to scale, the emphasis instead being placed upon clearly illustrating the principles of the present light emitting module and light source device. Moreover, in the drawings, like reference numerals designate corresponding parts throughout the several views.

DETAILED DESCRIPTION

Reference will now be made to the drawings to describe preferred embodiments of the present light emitting module and light source device, in detail.

Figure 1:
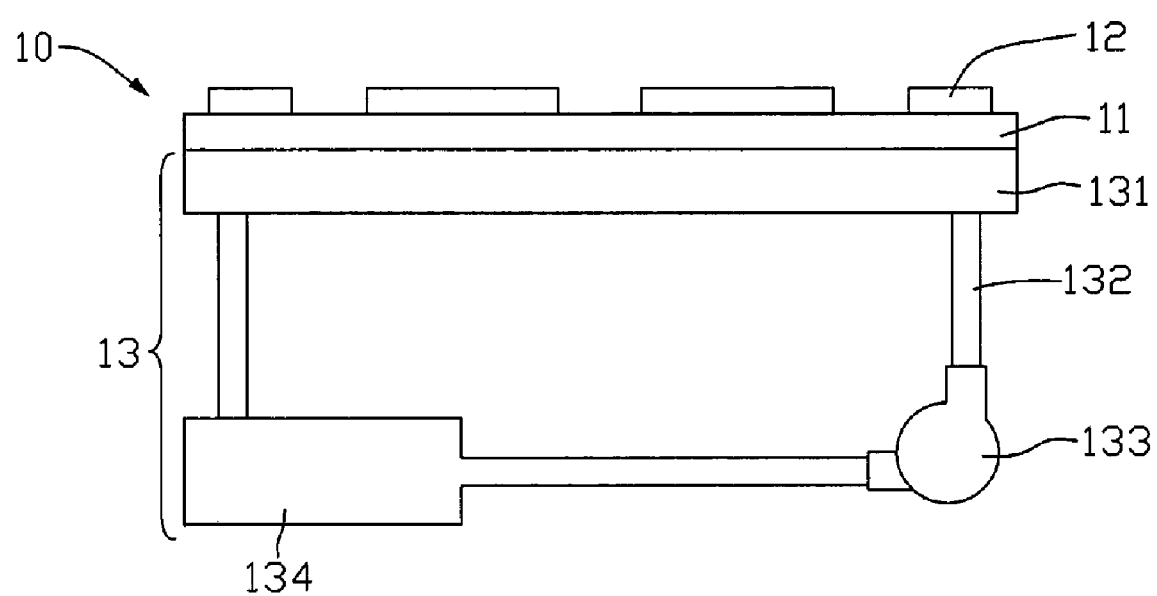
FIG. 1 is a schematic, side view of a light emitting module in accordance with a preferred embodiment.

Referring to FIG. 1, a light emitting module 10, in accordance with a preferred embodiment, is shown. The light emitting module 10 includes a metal circuit board 11, a plurality of light emitting units 12 arranged on the metal circuit board 11, and a cooling system 13 attached to an underside of the metal circuit board 11.

The metal circuit board 11 may be a metal printed circuit board that has a plurality of driving circuits (not shown) thereon. The driving circuits can provide driving currents for controlling the plurality of light emitting units 12 to emit white light with desired brightness. The metal circuit board 11 can be made from a heat conducting material with a high heat conducting property, such as Cu, Al, or theirs alloy. Thus, heat generated by the light emitting units 12 can be effectively conducted to the metal circuit board 11.

The cooling system 13 includes a hollow heat receiving portion 131, a cooling pipe 132 communicating with the heat receiving portion 131, and a cooling liquid with a high heat capacity, such as water or a supercritical liquid. The heat receiving portion 131 is attached to a bottom surface of the metal circuit board 11. The heat receiving portion 131 and the cooling pipe 132 cooperatively define a circulatory liquid passage for the circulation of the cooling liquid therein. The cooling pipe 132 can be configured to be in a curved or spiral fashion for economizing space occupied by the light emitting module 10. In addition, a pump 133 can be provided in the liquid passage for enhancing the flow of the cooling liquid in the liquid passage. Furthermore, a cooling tank 134 can be arranged in the liquid passage for supplying the cooling liquid and enhance the cooling efficiency of the cooling liquid. Preferably, a thermal interface material can be applied between the metal circuit board 11 and the heat receiving portion 131 for enhancing the heat conducting efficiency therebetween. Nanomaterials such as carbon nanotubes can also be admixed in the thermal interface material for further enhancing the heat conducting efficiency associated therewith.

Figure 2:
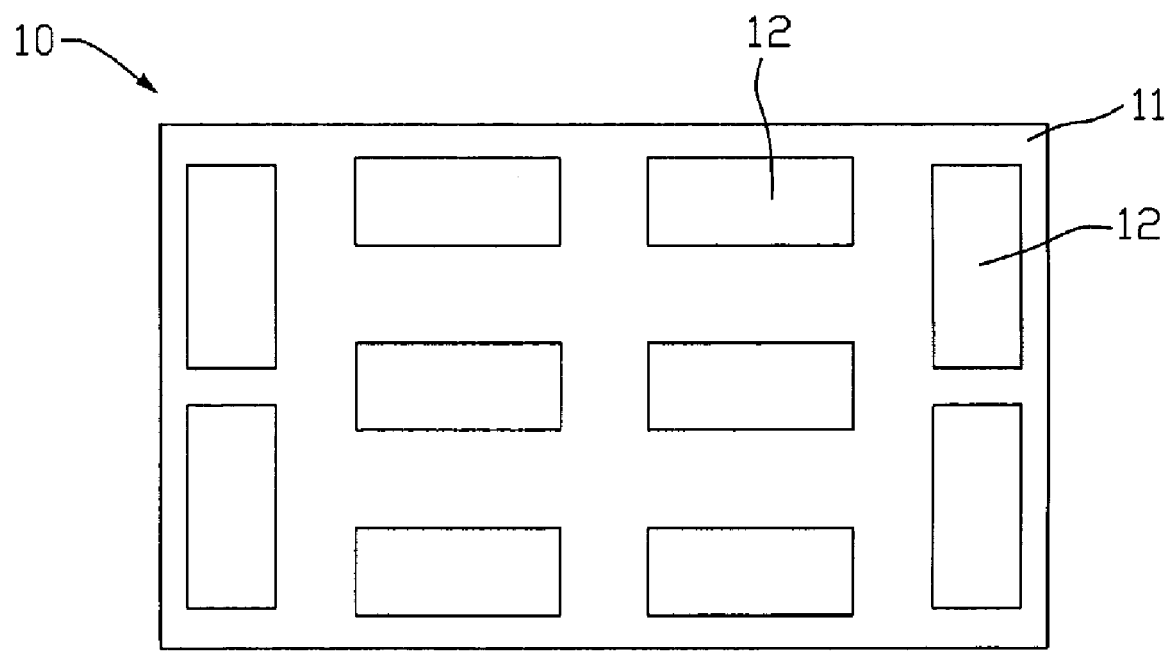
FIG. 2 is a schematic, top view of the light emitting module of FIG. 1.

Referring to FIG. 2, the plurality of light emitting units 12 are regularly arranged on the metal circuit board 11. As illustrated, ten white light emitting units 12 are used in the preferred embodiment, of which six light emitting units 12 are evenly arranged on an intermediate portion of the metal circuit board 11 in two columns, and the other four light emitting units 12 are evenly, arranged adjacent two opposite lateral edges of the metal circuit board 11. The four light emitting units 12 are preferably lengthways perpendicular to the six light emitting units 12. This configuration ensures that an evenly brightness of the light emitting module 10 can be obtained. Understandably, of the configuration of the light emitting units 12 is not limited to the present embodiment. If the number of the light emitting units 12 arranged on the intermediate portion of the metal circuit board 11 is increased or decreased, the number of the light emitting units 12 arranged adjacent two edges of the center light emitting units 12 needs to be correspondingly increased or decreased.

Figure 3:
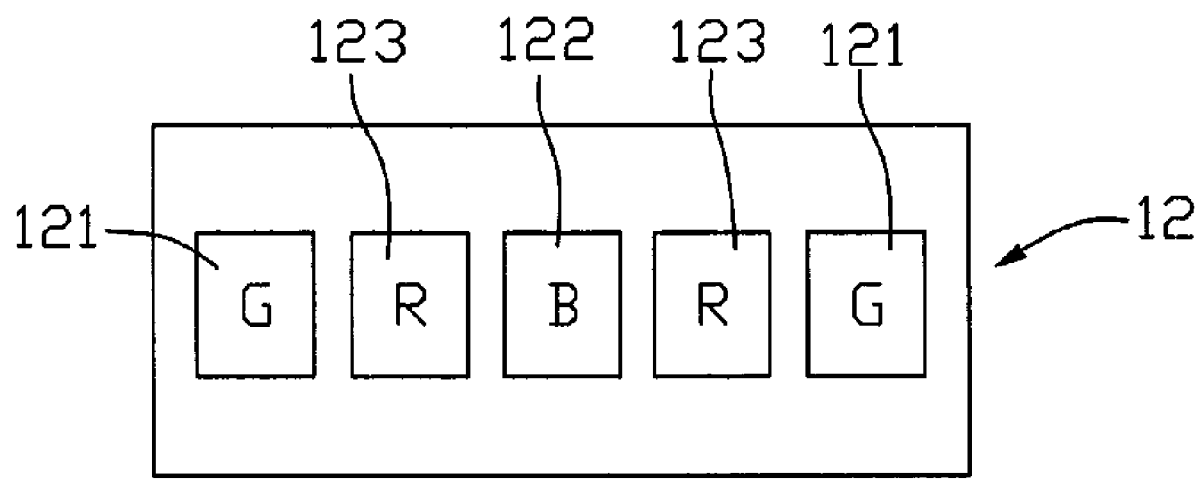
FIG. 3 is a schematic, plan view of an exemplary light emitting unit of the light emitting module of FIG. 1.

Referring to FIG. 3, a configuration of an exemplary light emitting unit 12 is shown. The light emitting unit 12 includes at least a red (R) LED 123, at least a green (G) LED 121, and at least a blue (B) LED 122 as light emitting elements. In the preferred embodiment, the light emitting unit 12 includes two red LED 123, two green LED 121, and a blue LED 122. The LEDs are arranged in an order of G-R-B-R-G thereby obtain a satisfactory white light. Alternatively, the LEDs of the light emitting unit 12 can also be arranged in the order of one of R-G-B-G-R, B-G-R-G-B, B-R-G-R-B, and G-B-R-B-G. The arrangement of the LEDs can be linear, as shown in FIG. 3, or curved, circular, etc. Alternatively, laser diodes (LDs) could also be used as the light emitting unit 12 in a similar way.

Figure 4:
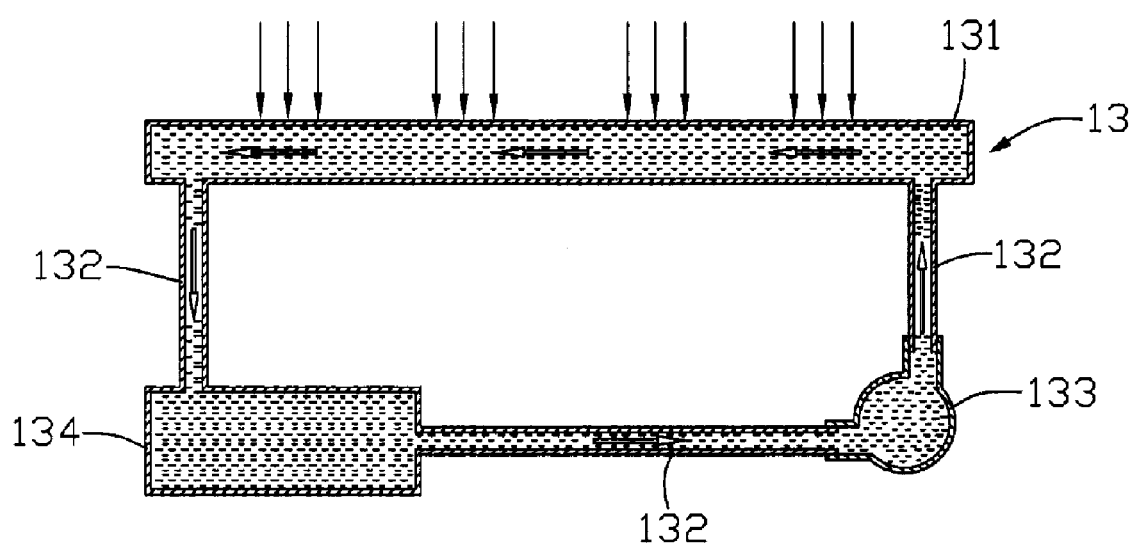
FIG. 4 is a schematic, cross-sectional view of a cooling system of the light emitting module of FIG. 1.

Referring to FIG. 4, a working process of the cooling system 13 is shown. The working process of the cooling system 13 includes the steps as follows: heat absorbed by the metal circuit board 11 is transferred to the heat receiving portion 131 (as indicated by the downward arrows). The heat is then transferred to the cooling liquid flowing in the heat receiving portion 131. The cooling liquid is driven by the pump 133 and circularly flows in the cooling passage. The heat is finally dissipated into the ambient air.

Compared with conventional light emitting module, the present light emitting module 10 has following advantages. Because the cooling system 13 is used, with the circulation of the cooling liquid in the cooling passage, the heat generated by the light emitting units 12 can be effectively dissipated. The temperature of the LEDs is lowered, and maintained in a safety range. Thus, the light emitting capability of the LEDs can be fully exploited. The brightness of the light emitting module 10 is improved, and the utilization efficiency of light thereof is also increased, accordingly.

Figure 5:
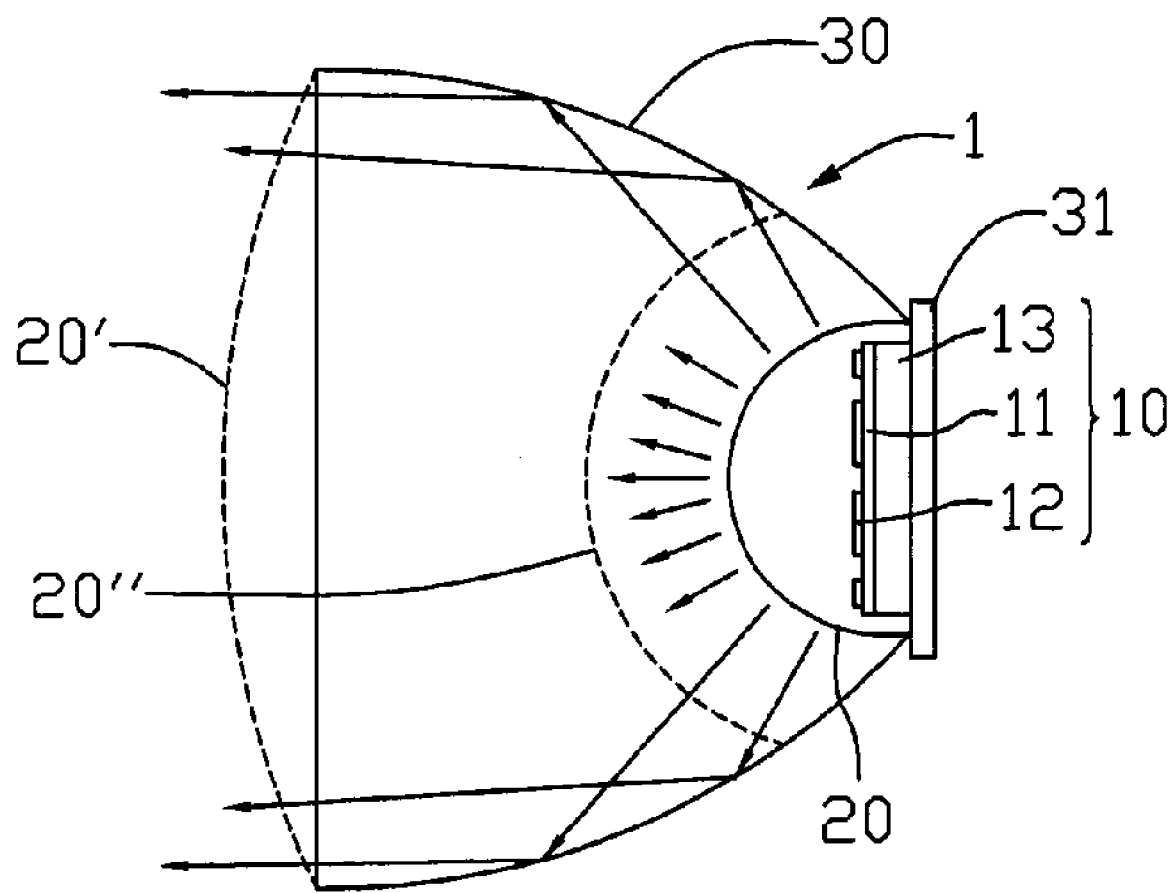
FIG. 5 is a schematic, cross-sectional view of a light source device in accordance with a preferred embodiment.

Referring to FIG. 5, a light source device 1 having the light emitting module 10 is shown. The light source device 1 includes a housing 30 with a base 31 for mounting the light emitting module 10 thereon, and a transparent light cover 20. The housing 30 and the light cover 20 cooperatively form a sealing space for accommodating the light emitting module 10. A shape of the housing 30 can be trumpet-shaped, cone-shaped, truncated cone-shaped, a combination of these shapes, or any other similar shapes. An inner surface of the housing 30 can be configured to be a reflective surface for reflecting the light emitted from the light emitting module 10 to the outside of the housing 30. The transparent light cover 20 can be a lens, or a prism. In the preferred embodiment, the transparent light cover 20 is attached to edge portions of the housing 30. Alternatively, the light cover 20 could be disposed at positions as indicated by broken line 20', broken line 20", or any positions therebetween. The light source device 1 can produce white light with high brightness, and is suitable for use as illumination light sources such as a desk lamp or a searchlight, or projection light sources.

It is to be understood that the above-described embodiment is intended to illustrate rather than limit the invention. Variations may be made to the embodiment without departing from the spirit of the invention as claimed. The above-described embodiments are intended to illustrate the scope of the invention and not restrict the scope of the invention.

What is claimed is:

1. A light emitting module, comprising:
   a metal circuit board;
   a plurality of light emitting units arranged on a first surface of the metal circuit board; and
   a cooling system mounted on an opposite second surface of the metal circuit board, wherein the cooling system comprises a hollow heat receiving portion attached to the second surface of the metal circuit board, a cooling pipe defining a liquid passage in communication with the heat receiving portion, and a cooling liquid received in the liquid passage.

2. The light emitting module as claimed in claim 1, wherein the cooling pipe is one of a curved pipe and a spiral pipe.

3. The light emitting module as claimed in claim 1, wherein the cooling system further comprises a pump arranged in the liquid passage for enhancing the flow of the cooling liquid in the liquid passage.

4. The light emitting module as claimed in claim 1, wherein the cooling system further comprises a cooling tank arranged in the liquid passage for supplying the cooling liquid and enhancing the cooling efficiency of the cooling liquid.

5. The light emitting module as claimed in claim 1, wherein the cooling system further comprises a thermal interface material applied between the metal circuit board and the heat receiving portion.

6. The light emitting module as claimed in claim 5, wherein the thermal interface material is incorporated with nanomaterials.

7. The light emitting module as claimed in claim 1, wherein the cooling liquid is one of water and supercritical liquid.

8. The light emitting module as claimed in claim 1, wherein the light emitting units are white light emitting units.

9. The light emitting module as claimed in claim 8, wherein each of the white light emitting units comprises a plurality of color light emitting diodes, or color laser diodes.

10. The light emitting module as claimed in claim 9, wherein the white light emitting unit comprises the plurality of color light emitting diodes, and the plurality of color light emitting diodes is arranged in an order selected from the group consisting of G-R-B-R-G, R-G-B-G-R, B-G-R-G-B, B-R-G-R-B, or G-B-R-B-G.

11. The light emitting module as claimed in claim 9, wherein the white light emitting unit comprises the plurality of color laser diodes, and the plurality of color laser diodes are arranged in an order selected from the group consisting of G-R-B-R-G, R-G-B-G-R, B-G-R-G-B, B-R-G-R-B, and G-B-R-B-G.

12. The light emitting module as claimed in claim 1, wherein the metal circuit board is a metal printed circuit board.

13. The light emitting module as claimed in claim 1, wherein the metal circuit board is comprised of heat conducting material with a high heat conducting property.

14. The light emitting module as claimed in claim 13, wherein the heat conducting material is selected from the group consisting of Cu, Al and theirs alloy.

15. A light source device, comprising:
a light emitting module comprising a metal circuit board, a plurality of light emitting units arranged on a first surface of the metal circuit board, and a cooling system mounted on an opposite second surface of the metal circuit board, wherein the cooling system comprises a hollow heat receiving portion attached to the bottom of the metal circuit board, a cooling pipe defining a liquid passage in communication with the heat receiving portion, and a cooling liquid received in the liquid passage;
a housing having a base with the light emitting module being mounted thereon; and
a transparent light cover covering the housing.

16. The light source device as claimed in claim 15, wherein an inner surface of the housing is a reflective surface for reflecting the light emitted from the light emitting module to the outside of the housing.

17. The light source device as claimed in claim 15, wherein the cooling system further comprises a pump arranged in the liquid passage for enhancing the flow of the cooling liquid in the liquid passage.

18. The light source device as claimed in claim 15, wherein the cooling system further comprises a cooling tank arranged in the liquid passage for supplying the cooling liquid and enhancing the cooling efficiency of the cooling liquid.

19. The light source device as claimed in claim 15, wherein the cooling system further comprises a thermal interface material applied between the metal circuit board and the heat receiving portion, wherein the thermal interface material is incorporated with nanomaterials.

20. The light source device as claimed in claim 15, wherein the cooling liquid is one of water and supercritical liquid.

* * * * *